United States Patent [19]

Klun et al.

[11] Patent Number: 4,956,265

[45] Date of Patent: Sep. 11, 1990

[54] RADIATION CROSSLINKABLE COMPOSITIONS

[75] Inventors: Thomas P. Klun; Aida F. Robbins; M. Zaki Ali, all of St. Paul, Minn.

[73] Assignee: Minnesota Mining and Manufacturing Company, St. Paul, Minn.

[21] Appl. No.: 467,900

[22] Filed: Jan. 22, 1990

Related U.S. Application Data

[62] Division of Ser. No. 151,879, Feb. 3, 1988, Pat. No. 4,914,165.

[51] Int. Cl.$^5$ .......................... G03C 1/73; G03F 7/032; C08F 283/00; C08L 75/06
[52] U.S. Cl. ..................... 430/283; 430/284; 430/285; 522/102; 522/90; 525/528
[58] Field of Search .................. 525/528; 522/102, 90; 430/285, 283, 284

[56] References Cited

U.S. PATENT DOCUMENTS

| | | | |
|---|---|---|---|
| 3,661,576 | 5/1972 | Crary | 430/285 |
| 4,228,232 | 10/1980 | Rousseau | 430/271 |
| 4,249,011 | 2/1981 | Wendling | 548/312 |

*Primary Examiner*—Marion C. McCamish
*Assistant Examiner*—Susan Berman
*Attorney, Agent, or Firm*—Donald M. Sell; Walter N. Kirn; Lorriane R. Sherman

[57] ABSTRACT

Aqueous solvent dispersible, radiation crosslinkable compounds and oligomers containing poly(ethylenically unsaturated) group-containing components and carboxyl groups are disclosed. Each compound is a monoester of a cyclic dicarboxylic acid anhydride and a 2-hydroxyalkylpolyester, said 2-hydroxyalkylpolyester being the ester of a polyepoxide with a monoester which is the monoester of a poly(ethylenically-unsaturated)alkanol and a dicarboxylic acid. These compounds and oligomers are useful in the field of graphic arts and protective coatings.

16 Claims, No Drawings

RADIATION CROSSLINKABLE COMPOSITIONS

This is a division of application Serial No. 07/151,879 filed Feb. 3, 1988 now U.S. Pat. No. 4,914,165 issued 02/03/90.

FIELD OF THE INVENTION

This invention relates to radiation crosslinkable compounds containing poly(ethylenically unsaturated) group-containing components and carboxylic acid groups and to a process for their preparation. In another aspect, the invention relates to photocurable compositions and articles prepared therefrom. The compounds, oligomers, compositions, and articles are useful in the field of graphic arts and protective coatings.

BACKGROUND ART

Ethylenically unsaturated oligomers and polymers resulting from the reaction of polyepoxides and unsaturated monocarboxylic acids have found widespread use in compositions and coatings that can be crosslinked to reduce the solubility and improve the chemical resistance of a cured product. In some instances where resistance to air inhibition of the crosslinking reaction has been desired, polyacrylic group-containing components have been introduced into the oligomers and polymers. In other instances where aqueous developability of coatings and films has been desired, carboxylic acid groups have been introduced into the oligomers and polymers.

In U.S. Pat. No. 3,367,992, there is disclosed thermosetting resins useful in laminates and the like. These resins are the reaction product of a hydroxyalkyl acrylate and a dicarboxylic acid anhydride. The partial ester obtained or its reaction product with a lower alkylene oxide may be reacted with polyfunctional reactants such as polyepoxides, polyisocyanates, polyamines and the like. Although products of the reaction of the partial ester of hydroxyalkyl acrylate and cyclic dicarboxylic acid anhydride with polyepoxides are described, the products do not contain polyacrylic group-containing components and carboxylic acid groups.

There are described in U.S. Pat. No. 3,448,089 copolymers suitable for coatings and printing plates containing a plurality of pendent acrylic ester groups and carboxylic acid groups. These copolymers, although being aqueous solution developable, do not contain poly(ethylenically unsaturated) group-containing components.

Curable compositions are described in U.S. Pat. No. 3,634,542 which contain the half ester prepared by reacting a polyepoxide with an ethylenically unsaturated organic monocarboxylic acid to form a hydroxy-substituted ethylenically unsaturated polyester that is then reacted with a dicarboxylic acid anhydride to esterify 5 to 100% of the hydroxyl groups. Such a reaction product, although developable with aqueous solutions, does not contain poly(ethylenically unsaturated) group-containing components.

In U.S. Pat. No. 3,980,483 there is described the free carboxylic group-containing esterification product of the addition compound of an epoxy resin and an α,β-unsaturated carboxylic acid with a dibasic carboxylic acid anhydride. Such a reaction product, although having free carboxylic acid groups and being therefore aqueous developable, does not contain poly(ethylenically unsaturated) group-containing components.

In U.S. Pat. No. 4,162,274 there is described a urethane resin suitable for resists and printing plates that is the reaction product of a polyepoxide and 60 to 100 mole percent of acrylic or methacrylic acid followed by reaction of 30 to 90 percent of the 2-hydroxyls formed with an isocyanate and 10 to 70% of the 2-hydroxyls with a dicarboxylic acid anhydride. Such a reaction product, although having free carboxylic acid groups and being therefore aqueous developable, does not contain poly(ethylenically) unsaturated group-containing components.

In U.S. Pat. No. 4,187,257 there is disclosed radiation crosslinkable resins that are the reaction product of a polyepoxide and a monoester of a dicarboxylic acid and a di- or tri-acrylate of pentaerythritol. It is stated at Col. 5 lines 30–36 that, "The resins of this invention are further modified by known procedures prior to curing. Thus, the secondary hydroxyls resulting from esterification of an oxirane group may be reacted with a Group II metal oxide or hydroxide to provide thickened resins useful in sheet molding compound and bulk molding compound. Other modifications will be apparent." The reaction products described in this patent, although containing poly(ethylenically unsaturated) group-containing components, do not contain carboxylic acid groups and therefore would not be aqueous developable.

In U.S. Pat. No. 4,228,232 (3M) there is disclosed a urethane oligomer useful in recording elements that is the reaction product of a polyester polyol or polyether polyol having p+q hydroxyl groups (p is 2 to 7.7 and q is 0.3 to 4) with p moles of the 1:1 reaction product of a hydroxyalkyl acrylate or methacrylate and a polyisocyanate followed by the reaction with q moles of dicarboxylic acid anhydride. Such a reaction product, although having free carboxliyc acid groups and being therefore aqueous developable, does not contain poly(ethylenically unsaturated) group containing components.

U.S. Pat. No. 4,249,011 discloses radiation curable oxygen insensitive systems that contain poly(ethylenically unsaturated alkoxyalkyl)heterocyclic compounds. These compounds are the reaction products of a poly(ethylenically unsaturated) primary alcohol and an poly epoxy-substituted heterocycle that can be acylated by various acylating agents, e.g., isocyanates including acryloyloxyethyl isocyanate, and dicarboxylic acid anhydrides such as succinic anhydride.

Japanese Patent No. 60-121444 (6/28/85) (abstract) describes a resin useful in photoresists and the like having high definition and good durability that is the reaction product of (1) a chain polymer having carboxyl, amino, thio, isocyanate or hydroxyl groups and having a number average molecular weight of 500 to 20,000; (2) two or more aromatic or alicyclic polyepoxide compounds; (3) an unsaturated compound having a group reactive with an epoxide group or a hydroxyl group, and (4) an acid anhydride or a compound having carboxyl or phenolic hydroxyl groups and one or more groups reactive with the functional groups in (1) or (2).

While materials are described in the above cited references which can provide compositions that on coated articles are rapidly crosslinked, insensitive to air inhibition, and aqueous developable, there is still need for improved materials that have still faster curing, are aqueous developable, have a low volatility, and have simplicity of preparation.

SUMMARY OF THE INVENTION

Briefly, the present invention provides a monoester of a cyclic dicarboxylic acid anhydride and a 2-hydroxyalkylpolyester, said 2-hydroxyalkylpolyester being the ester of a polyepoxide with a monoester which is the monoester of a poly(ethylenically-unsaturated) alkanol and a dicarboxylic acid. In another aspect, a process for the preparation of such compounds is provided. In a further aspect, radiation crosslinkable coating compositions and elements comprising the compounds are provided.

Compounds of the invention which are polymerizable by free radicals are prepared by a process comprising the steps:

(a) preparing a monoester of a poly(ethylenically unsaturated) alkanol and a dicarboxylic acid, (b) condensing the monoester with a polyepoxide to yield a polyester having 2-hydroxyalkyl ester groups and poly(ethylenically unsaturated) groups, (c) reacting 0 to 95 percent of the hydroxy groups in the polyester with an ethylenically unsaturated compound having a group reactive with the hydroxyl groups, and (d) esterifying 5 to 100 percent of the hydroxy groups of the polyester having 2-hydroxyalkyl ester groups with a cyclic dicarboxylic acid anhydride to yield a compound having poly(ethylenically unsaturated) groups and carboxyl groups that is polymerizable by free radicals.

The present invention provides compounds and a process for their preparation, the compounds having both poly(ethylenically unsaturated) group-containing components and carboxylic acid groups in one molecule, the compounds and oligomers being radiation crosslinkable, resistant to air inhibition of the crosslinking reaction, and also aqueous solvent dispersible.

In this application:
"poly" means two or more;
"plurality" means two or more;
"component" means a group or moiety;
"catenary" means in the backbone rather than an end group or in a pendent group; and
"compound" means a molecule having a single unit or two or more units and includes oligomers and polymers.

DETAILED DESCRIPTION OF THE INVENTION

The free radically polymerizable compound of the invention that contains a plurality of ethylenically unsaturated groups and carboxyl groups is produced by a process comprising the steps:

1. preparing a monoester of a poly(ethylenically unsaturated)alkanol and a dicarboxylic acid by the reaction of a poly(ethylenically unsaturated)alkanol and a dicarboxylic acid or its anhydride, said monoester, designated "Product A", having the general formula:

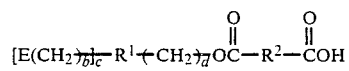

in which

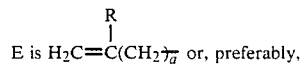

E is $H_2C=C(CH_2)_a$ or, preferably,

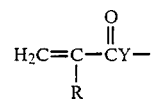

in which R is hydrogen, halogen, or methyl, and Y is —O— or

in which
$R^{10}$ is hydrogen or lower alkyl of 1 to 4 carbon atoms;
a is an integer of 1 to 6;
b is zero or an integer of 1 to 6, preferably 1;
c is an integer of 2 to 5, preferably 3;
$R^1$ is a polyvalent aliphatic group having 1 to 15 carbon atoms and a valence of c+1, and optionally containing one or two catenary (i.e., backbone) oxygen or

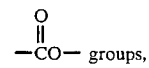

preferably $R^1$ is an alkanepolyyl group having a valence of 2 to 5, and, most preferably $R^1$ is

d is zero or an integer of 1 to 6; and
$R^2$ is a divalent linear or branched saturated or unsaturated aliphatic group having 2 to 10 carbon atoms and, optionally, one ether oxygen atom, a cycloalkylene group having 5 to 7 atoms in the ring and up to 5 carbon atoms in one or more pendent groups, or a divalent arylene group having 6 to 10 carbon atoms;

2. condensing the monoester with a polyepoxide to yield a polyester having 2-hydroxyalkyl ester groups and poly(ethylenically unsaturated) groups, designated "Product B";

3. reacting 0 to 95 percent of the hydroxy groups in the polyester with an ethylenically unsaturated compound having a group reactive with hydroxy groups, and 4. esterifying 5 to 100 percent of the hydroxy groups of the polyester having 2-hydroxyalkyl groups with a cyclic dicarboxylic acid anhydride to yield a free-radically polymerizable compound having poly(ethylenically unsaturated) groups and carboxyl groups, designated "Product C".

Preferably, the free radically polymerizable compounds of the invention, "Products C", have the general formulae:

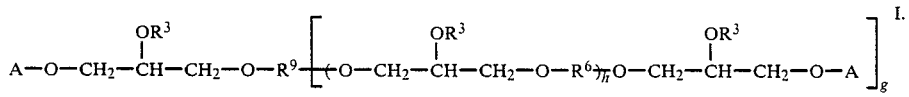

wherein

A is 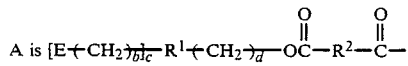

in which
E, b, a, $R^1$, d, and $R^2$ are defined above; and
h is zero or a number having an average value up to about 20;
$R^3$ is selected from hydrogen,

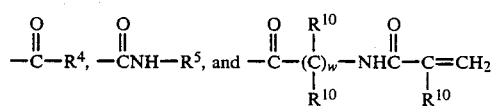

in which each $R^{10}$ is hydrogen or lower alkyl of 1 to 4 carbon atoms, and each $R^4$ and $R^5$ is independently an organic group selected from alkyl groups having 1 to 10 carbon atoms, ethylenically unsaturated groups having 2 to 10 carbon atoms including vinyl groups and acryloyloxy groups and acrylamido groups, cycloalkyl groups having 5 to 7 ring carbon atoms and a total of 5 to 10 carbon atoms, and aryl groups having 6 to 10 carbon atoms with the provision that 5 to 100 mole percent of all $R^3$s are

in which $R^4$ is as defined above and is substituted by

and w is 1 or 2;
$R^6$ is a divalent organic group, preferably selected from groups having the formulae:

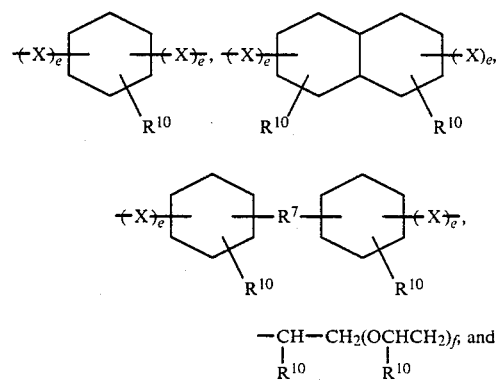

in which each

is cyclohexyl or phenyl nucleus, $R^7$ is a covalent bond, —O—, —$SO_2$—,

alkylene such as —$CH_2$—, —$CH_2$—$CH_2$—, —$CH_2CH_2CH_2$— or

e is zero or one, X is

or a covalent bond, f is a number having an average value from about 5 to 200, and $R^8$ is a linear or branched chain alkylene groups having 2 to about 1000 carbon atoms, and each R is independently hydrogen or methyl;
$R^9$ is $R^6$ or a polyvalent organic group having a valence of g+1 (in which g is an integer having a value of of 1 to 10) that is aliphatic, cycloaliphatic, or aromatic and having a weight average molecular weight of about 28 to 1000, preferably $R^9$ is $R^6$ or is selected from residues having the general formulae:

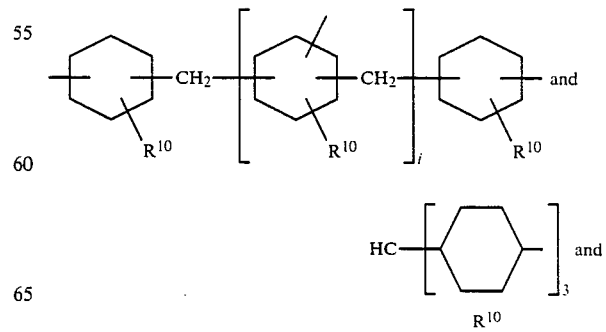

wherein

 5 is as defined above, and each $R^{10}$ independently is hydrogen or lower alkyl of 1 to 4 carbon atoms.
and i is zero or a number having an average value of up to about 9 or more and each R is independently hydrogen or methyl;
with the proviso that when $R^9$ is not $R^6$ then h is zero;

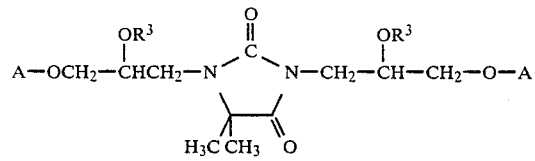 II

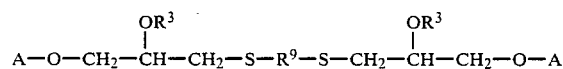 III

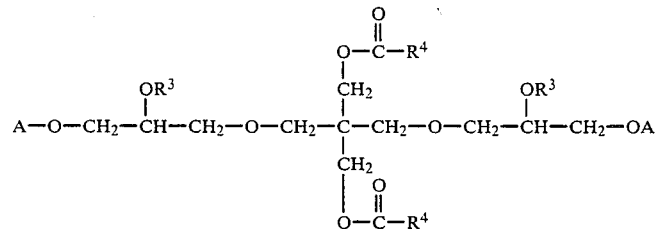 IV

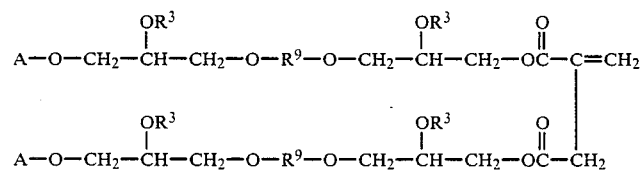 V wherein in formula II, III, IV, and V, A, $R^3$, $R^4$, and $R^9$, are defined above.

The radiation crosslinkable coating compositions of the invention comprise the compounds containing both poly(ethylenically-unsaturated) group-containing components and carboxyl groups, optionally a copolymerizable ethylenically unsaturated monomer or an organic film forming binder, and a radiation sensitive initiator system capable of initiating free radical polymerization upon absorption of electromagnetic radiation.

The elements of the invention comprise substrates bearing a layer of the radiation crosslinkable composition that is readily polymerizable even in the presence of atmospheric oxygen and can thus provide the substrate with highly crosslinked coatings having improved solvent and abrasion resistance and also excellent adhesion. The elements can also be photosensitive high speed imaging elements that are developable by aqueous base and useful for photoresists and printing plates.

The process for the novel compounds of the invention that contain both poly(ethylenically unsaturated) group-containing components and carboxyl groups, Products C, is summarized in the equations below:

Step 1

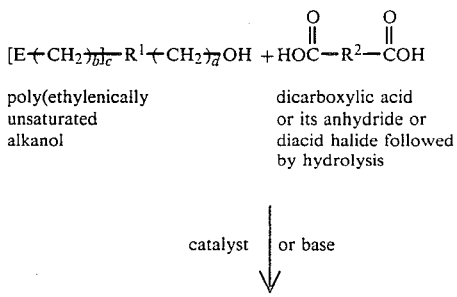

poly(ethylenically unsaturated alkanol dicarboxylic acid or its anhydride or diacid halide followed by hydrolysis catalyst or base

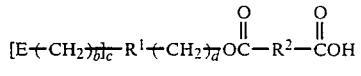

monoester of a poly(ethylenically unsaturated)-alkanol and a dicarboxylic acid (Product A)

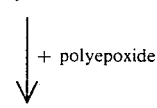

+ polyepoxide poly(ethylenically unsaturated) polyester having 2-hydroxyalkyl ester groups (Product B)

Step 3 optionally reacting Product B with an ethylenically unsaturated compound having a group reactive with hydroxyl groups Further unsaturated Product B (modified Product B)

Step 2

Step 4

-continued

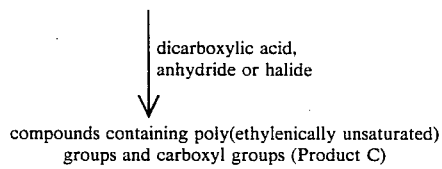

compounds containing poly(ethylenically unsaturated)
groups and carboxyl groups (Product C)

wherein E, $R^1$, $R^2$, b, c, and d are as previously defined.

Poly(ethylenically unsaturated)alkanols of use in Step (1) of the preparation of the compounds of the invention are known and include, for example, the diacrylates and methacrylates of aliphatic triols such as glycerine, trimethylolmethane, 1,1,1-trimethylolpropane, 1,2,3-trimethylolpropane; the triacrylates and methacrylates of aliphatic tetrols such as pentaerythritol, 1,1,2,2-tetramethylolethane, 1,1,3,3-tetramethylolpropane, 1,1,1,3-tetramethylolpropane, 1,1,1,4-tetramethylolbutane; the tetraacrylates and methacrylates of aliphatic pentols such as 1,1,1,2,2-pentamethylolethane, and 1,1,1,4,4-pentamethylolbutane; the pentacrylates and methacrylates of aliphatic polyols such as dipentaerythritol, 1,1,1,2,2,2-hexamethylolethane and tripentaerythritol.

The poly(ethylenically unsaturated)alkanol is esterified with a dicarboxylic acid in Step 1. Although dicarboxylic acids and their halides can be used to form the monoester of the dicarboxylic acid, the esterification is performed with a cyclic dicarboxylic acid anhydride since esterification with a dicarboxylic acid or its diacid halide generally results in formation of some diester. After reaction with the diacid halide, hydrolysis of the monoacid halide formed is necessary to provide the carboxylic acid. Examples of the preferred anhydrides include the saturated cyclic dicarboxylic acid anhydrides such as succinic anhydride, glutaric anhydride, 2-methylsuccinic anhydride and dimethylsuccinic anhydride; the unsaturated cyclic dicarboxylic anhydrides such as maleic anhydride, chloromaleic anhydride, citraconic anhydride, itaconic anhydride; and aromatic dicarboxylic acid anhydrides such as phthalic anhydride, nadic anhydride, 3-chlorophthalic anhydride, 3-methylphthalic anhydride, and 3,4,5-trifluorophthalic anhydride.

The esterification reaction (Step 1) of the poly(ethylenically unsaturated)alkanol with the cyclic dicarboxylic anhydride to form a monoester of a poly(ethylenically unsaturated)alkanol and a dicarboxylic acid (Product A) is preferably performed by heating at 25° to 125° C., preferably 90° to 110° C., a mixture of from about 0.9 to 1.1 moles of cyclic dicarboxylic anhydride and 1.0 mole of the poly(ethylenically unsaturated)alkanol until a sample of the reaction mixture on examination by infrared spectroscopy shows disappearance of anhydride, generally, from 0.5 to 50 hours. It is desirable that there be included in the reaction mixture a reaction catalyst such as an ammonium salt, for example, benzyltriethylammonium chloride or a strong acid, for example, p-toluenesulfonic acid and that the reaction be performed under a dry atmosphere. It is also desirable that there be included in the reaction mixture a polymerization inhibitor, such as for example, t-butylcatechol or 4-methoxyphenol.

The reaction (Step 2) of the monoester (Product A) from Step 1 with a polyepoxide to form a polyester having 2-hydroxypropyl ester groups (Product B) is performed by heating a mixture of one acid equivalent weight with 0.8 to 1.2 epoxy equivalent weights of polyepoxide at 50 to 150° C. until analysis by titration of the reaction mixture shows the desired degree of completion with respect to acid and epoxy groups, generally after about 5 to 100 hours. The reaction is preferably carried out in the presence of a catalyst such as the esterification catalyst used in Step 1 and a polymerization inhibitor. It is also preferable that the reaction be performed in an aprotic solvent, such as for example, butyl acetate, trichloroethane and toluene. Polyepoxides that can be used are any of the known polyepoxides, and include polyepoxides made by the reaction of aromatic, aliphatic, or cycloaliphatic compounds containing two or more of hydroxyl, carboxyl, amino, or mercapto groups with an epihalohydrin and by the peroxidation of organic compounds containing two or more ethylenically unsaturated groups.

Examples of such polyepoxides include but are not limited to diglycidyl ethers of bisphenols such as those having the general formula

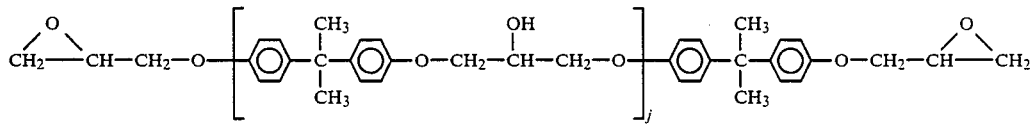

wherein j is zero or a number having an average value up to about 20 or more that are available from Dow Chemical Co., Shell Chemical Co. and Ciba Geigy under the names of DER ™, Epon ™, and Araldite ™, respectively; polyglycidyl ethers of other polyvalent phenols, for example pyrocatechol; resorcinol, hydroquinone; bis(4-hydroxyphenylmethane), bis(3-methyl-4-hydroxyphenyl)methane, 1,1-bis(4-hydroxyphenyl)ethane, 1,4-bis(hydroxyphenyl)cyclohexane, 2,2-bis(4-hydroxyphenyl)propane, 2,2-bis(4-hydroxy-3-methylphenyl)propane, bis(4-hydroxyphenyl)sulfone, and tris(4-hydroxyphenyl)methane; polyglycidyl ethers of the halogenated, such as chlorinated and brominated products of the above-mentioned diphenols; polyglycidyl ethers of novolacs (i.e., reaction products of monohydric or polyhydric phenols with aldehydes, formaldehyde in particular, in the presence of acid catalysts) that are available under the name DEN ™ from Dow; polyepoxy compounds based on aromatic amines, for example, N,N-diglycidylaniline, bis[4-(N-methyl-N-glycidylamino)phenyl]methane, 4-diglycidylaminophenyl glycidyl ether, available as Araldite ™ MY-510 from Ciba-Geigy, 1,3-bis[(4-diglycidylamino)phenyl]propane, 1[(4 diglycidylamino)phenyl]methane, available as Araldite ™ MY-721 from Ciba Geigy.

Other suitable polyepoxides include those of hydrogenated bisphenols such as bis(4-glycidyloxycyclohexyl)methane, available from Shell as DRH ™ 151.0; and bis(4-glycidyloxyphenyl)methane, available from Dow as Tactix ™ 748, the glycidyl esters of aromatic and cycloaliphatic acids, for example diglycidyl phthlate such as Denacol ™ EX-721 available from Nagase Chemical Co. and diglycidyl cyclohexanedicarboxylate available as Araldite ™ CY 184 from Ciba-Geigy.

Still other suitable polyepoxides are the glycidyl ethers of polyhydric alcohols, for example the alkylenediols such as

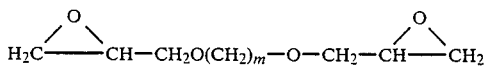

where m is 2, 4, or 6 and 2,2-dimethyl-1,3-diglycidyloxypropane that are available as Denacol ™ polyepoxides from Nagase Chemical Co., the polyoxyalkylene diols, such as

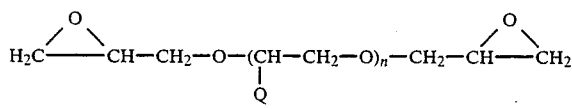

where n = 1 to 22 and wherein Q is hydrogen or methyl, available as Denacol ™ 810, 811, 830 etc. from Nagase Chemical Co.

Yet other suitable polyepoxides include triglycidyl isocyanurate, polyglycidyl thioethers of polythiols such as bis(glycidylthioxymethyl)benzene, and 1,1,2,2-tetra (4-glycidyloxyphenyl) ether available as Epon ™ 1031 from Shell Chemical Company.

The reaction (Step 4) of the polyester having 2-hydroxyalkyl ester groups (Product B or modified Product B) from Step 2 or Step 3 to form compounds and oligomers containing poly(ethylenically unsaturated) groups and carboxyl groups (Product C) is carried out, preferably, by reaction of the polyester with a cyclic dicarboxylic acid anhydride. The compounds can be prepared by reaction of Product B or modified Product B with a dicarboxylic acid or its diacid halide when it is generally performed in the presence of alkali such as sodium or potassium hydroxide or carbonate. When the diacid halide is used, hydrolysis of the mono acid halide formed is necessary to provide the carboxylic acid. When the reaction is carried out by reaction of the polyester with a cyclic dicarboxylic anhydride, there is used from about 0.05 to 1.1 or more moles of cyclic dicarboxylic anhydride per equivalent of hydroxyl group in the polyester Product B until 5 to 100 mole percent of the hydroxyl groups have been esterified to form a carboxyl substituted group, i.e.,

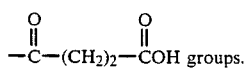

The reaction can be performed in an aprotic solvent, under a dry atmosphere, in the presence of up to an equivalent amount of tertiary amine, such as triethylamine, and with added polymerization inhibitor, such as t-butylcatechol or 4-methoxyphenol.

It is optional, but preferable, that up to 95 percent, most preferably 20 to 80 percent of the hydroxyl groups of Product B be caused to react with an ethylenically unsaturated compound having a group reactive with hydroxyl groups as described in Step 3. The reaction is carried out, preferably by mixing Product B and the unsaturated compound in amounts to provide up to 0.95 mole, preferably 0.20 to 0.80 mole, of the unsaturated compound having a group reactive with hydroxyl groups per equivalent of hydroxyl group present in Product B. The mixture is then heated at 20° C. to 75° C. for a time until infrared spectrum confirms the absence of the group reactive with hydroxyl groups, generally about one hour to 48 hours or more. When the hydroxyl groups of Product B are to be reacted with an ethylenically unsaturated compound having groups reactive with hydroxyl groups, it is preferable that this reaction be brought about before the reaction of Product B with cyclic anhydride since the Product C if reacted with cyclic anhydride first would then contain carboxylic groups that, generally, would also be reactive with groups reactive with hydroxyl groups.

Ethylenically unsaturated compounds having a group reactive with hydroxyl groups useful for reaction with the hydroxyl groups of Product B to give the modified Product B as described by Step 3 are ethylenically unsaturated isocyanates and alkenylazlactones. Preferred ethylenically unsaturated isocyanates useful for reaction with Product B are omega-isocyanatoalkyl acrylates and methacrylates including, for example 2-isocyanatoethyl acrylate and methacrylate, 3-isocyanatopropyl acrylate and methacrylate, 2-acrylamidoethylisocyanate, 3-acrylamidopropylisocyanate, 3-methacrylamidopropylisocyanate, 2,3-bis(acryloyloxy)propylisocyanate, 3,3,3-tris(acryloyloxymethyl)-propylisocyanate, 4-methacryloylbxycyclohexylisocyanate, 5-acryloyloxmethyl1,3,3, 5-trimethylcyclohexylisocyanate, allylisocyanate, methallylisocyanate, and the reaction product of one mole of an ethylenically unsaturated alcohol with one mole of an organic diisocyanate. Examples of useful ethylenically unsaturated alcohols include allyl and methallyl alcohols, 2-hydroxyethyl acrylate and methacrylate, 3-hydroxypropyl acrylate and methacrylate, 1,1,1-trimethylolpropane diacrylate and dimethacrylate, pentaerythritol triacrylate and trimethacrylate. Organic diisocyanates that can be used are any of the well-known diisocyanates. Preferred diisocyanates are toluene diisocyanate, isophorone diisocyanate and hexamethylene diisocyanate.

Alkenylazlactones, which can be caused to react with the 2-hydroxyalkyl groups of Product B to give the modified Product B as described in Step 3, include, for example, 2-ethenyl-1,3-oxazolin-5-one, 2-isopropenyl-1,3-oxazolin-5-one, 2-isopropenyl-4,4-dimethyl-1,3-oxazolin-5-one, 2-ethenyl-4,4-dimethyl-4H-1,3-oxazine-6-one and 2-isopropenyl-4,4,dimethyl-4H-1,3-oxazine-6-one. The reaction with Product B is performed at 0° C. to 50° C. under atmospheric pressure in the presence of about 0.1 to 5 percent by weight of a Lewis acid such as BF$_3$-etherate, AlCl$_3$, or SnCl$_4$, or a base such as a tertiary amine (e.g., benzyldimethylamine) as catalyst. Other 2-alkenylazlactones and conditions that can be used are described in assignee's copending patent application Ser. No. 316,234, filed Oct. 29, 1981, which is incorporated herein by reference.

The radiation crosslinkable compositions of the invention are prepared by dissolving the free radically polymerizable compounds, i.e., the Product C compounds, in a suitable solvent to a concentration of about 1 to 20%, preferably about 5 to 10% by weight. When the Products C have been prepared in solvent, it may be necessary only to add additional solvent to reach the desired concentration. Examples of solvents that can be used include acetone, methyl ethyl ketone, methanol, ethanol, n-propanol, isopropanol, ethyl acetate, benzene, toluene, tricholoroethylene and the like. Preferred solvents are the aqueous alcohols.

Although, the compounds of the invention can provide radiation sensitive compositions that do not contain toxic volatile monomers, it may be desirable to include about 0.05 to 2.0 part of a copolymerizable ethylenically unsaturated monomer per part of Product C by weight in the radiation sensitive compositions. Preferred monomers that can be used are the acrylic and methacrylic acid esters such as, for example, ethyl acrylate, butyl acrylate, n-octyl acrylate., allyl acrylate, cyclohexyl acrylate, N-methylcarbamoyloxyethyl acrylate, neopentylglycol diacrylate, 1,6-hexanediol diacrylate, pentaerythritol triacrylate and tetraacrylate, 1,3,5-tri(2-acryloyloxyethyl)isocyanurate, and the corresponding methacrylates.

Binders that are suitable for use in the radiation sensitive coating compositions of the invention are organic film forming polymers having a number average molecular weight of at least 1,000, but it can be as high as 1,000,000 or more depending on the particular binder. Preferred organic polymers suitable for use as a binder are the polyvinyl acetals such as polyvinyl formal, polyvinyl butyral, and mixtures thereof. Polyvinylmethylether, polyvinyl alcohol, hydroxyalkylcellulose (e.g., hydroxypropylcellulose), polyamides, polyvinylacetate, polyvinylacetate-polyvinylchloride copolymers, polyethyleneoxides, and polyacrylates.

The compositions of the present invention must also have a radiation sensitive system capable of initiating free radical polymerization upon absorption of radiation. Free radical initiators are materials known in the art, such as are disclosed in "Free-Radical Chemistry", D. C. Nonhebel and J. C. Walton, University Press (1974). Particularly suitable free radical generators can be selected from many classes of organic compounds including, for example, organic peroxides, azo compounds, aromatic diazonium salts, aromatic iodonium salts, aromatic sulfonium salts, aromatic phosphonium salts, quinones, benzophenones, nitroso compounds, acyl halides, aryl halides, hydrazones, mercapto compounds, pyrylium compounds, triarylimidazoles, biimidazoles, chloroalkyltriazines, etc. These materials, in general, must have photosensitizers therewith to form a photoinitiator system. Photosensitizers are well known in the art. The free radical initiator is used at a concentration from about 0.01 to 10 percent by weight of the solids content of the coating composition.

Additional references in the art to free radical photoinitiator systems for ethylenically unsaturated compounds are included in U.S. Pat. No. 3,887,450 (e.g., column 4), U.S. Pat. No. 3,895,949 (e.g. column 7), and U.S. Pat. No. 4,043,819. Preferred initiators are the onium salts as disclosed in U.S. Pat. Nos. 3,729,313; 4,058,400; and 4,058,401. Other desirable initiators are biimidazoles (disclosed in U.S. patent application Ser. No. 824,733, filed Aug. 15, 1977) and chloroalkyltriazines as disclosed in U.S. Pat. No. 3,775,113. These references also disclose sensitizers therein. Another good reference to photoinitiator systems is "Light-Sensitive Systems", J. Kosar, 1965, J. Wiley and Sons, Inc. especially Chapter 5.

Depending on the particular application of the coating composition it may be desirable to include in the composition conventional antioxidants, thermal stabilizers or free radical inhibitors in order to prolong storage life of the composition. Examples of such materials are butylated hydroxyanisole (BHA) and butylated hydroxytoluene (BHT) commercially available as Ionox TM 220 (Shell), Santonox TM R (Monsanto), Irganox TM 1010 (Ciba-Geigy), etc. Generally, from 0.01 to 5.0 percent by weight of the total weight of the coating composition can be used.

The properties of the coatings can be further modified by including in the coating composition a variety of adjuvants utilized for their known purpose, such as lubricants, plasticizers (e.g. dibutyl phthalate), tackifying resins (e.g., the copolymer of styrene and methylstyrene), inorganic thickeners, fillers (e.g., organic and inorganic particles, fibers, and flakes), pigments and dyes. Fillers can generally be used in proportions up to about 200 parts by weight per 100 parts by weight of copolymerizable components of the coating compositions.

The photopolymerization of the compositions of the invention occurs on exposure of the compositions to any source of radiation emitting actinic radiation at a wavelength within the ultraviolet and visible spectral regions. Suitable sources of radiation include mercury, xenon, carbon arc and tungsten filament lamps, lasers, sunlight, etc. Exposures may be from less than about 1 second to 10 minutes or more depending upon the amounts of particular polymerizable materials, the photopolymerization catalyst being utilized and depending upon the radiation source and distance from the source and the thickness of the coating to be cured. The compositions may also be polymerized by exposure to electron beam irradiation. Generally speaking, the dosage necessary is from less than 1 megarad to 100 megarad or more. One of the major advantages with using electron beam curing is that highly pigmented compositions can be effectively cured at a faster rate than by mere exposure to actinic radiation.

For certain applications thermal polymerization can be used. Suitable heat activated free-radical initiators include, for example, benzoyl peroxide, lauroyl peroxide, dicyclohexyl percarbonate, and azo-bis-(isobutyronitrile). Generally, the heat activated initiator is present in an amount of about 0.1 to 5.0 weight percent based on the amount of the polymerizable composition of the invention. When the initiator is present in an amount less than about 0.1 weight percent, the polymerization rate is extremely slow. When the initiator is present in excess of about 5 weight percent, no corresponding improvement in polymerization is generally seen.

When thermal energy is used for curing, the composition or article is heated, preferably at a temperature of about 50 to 150° C., for a period of time sufficient to achieve the desired degree of crosslinking of the coating. Generally, adequate crosslinking can be achieved in from about 1 to 10 minutes or more depending on coating thickness, amount of polymerizable materials, the polymerization initiator being used, and the temperature. When temperatures above about 150° C. are used for a sufficient period of time, e.g., 1 minute to several hours, crosslinking may occur without added polymerization initiators.

The radiation and thermally crosslinkable compositions are particularly suitable for applications in the field of protective coatings and graphic arts because of their superior abrasion-resistance and adhesion to many rigid, resilient and flexible substrates such as metals, plastics, rubber, glass, paper, wood, and ceramics; their aqueous dispersibility (some compounds being aqueous soluble); their excellent resistance, when cured, to most solvents and chemicals; and their capability for forming high resolution images. Among such uses are water or water/alcohol developable resists for chemical milling, gravure images, offset plates, proofing, stencil making, screenless lithograph, relief printing plates, printed circuits, radiation cured protective coatings for glass, metal surfaces and the like. Also, because many of the polyesters of the invention are form-stable, they do not flow at temperatures below about 30° C., and many are non-tacky at these temperatures.

Objects and advantages of this invention are further illustrated by the following examples, but the particular materials and amounts thereof recited in these examples, as well as other conditions and details, should not be construed to unduly limit this invention.

EXAMPLE 1

Step 1. The preparation of a "Product A", the adduct of pentaerythritol triacrylate and succinic acid (SAMP).

A 3-liter 3-necked round bottom flask equipped with overhead stirrer and reflux condenser under a dry air atmosphere was charged with 1614.4g (410 hydroxy equivalent weight, 3.9 eq.) of pentaerythritol triacrylate {Sartomer SR 444C (47.9% triacrylate, 29,0% tetraacrylate and 1.2% of diacrylate by liquid chromatography)}, 375 g of succinic anhydride (100 molecular weight, 3.75 eq.) and 9.94g (0.5% by weight) benzyltriethylammonium chloride and heated at 105° C. for 24 hours. At this time infrared spectroscopy showed disappearance of the succinic anhydride bands (1860 cm$^{-1}$, weak and 1780 cm$^{-1}$, strong). Triplicate titrations of the reaction mixture in butyl acetate/isopropanol indicated that the average acid equivalent weight was 510 (theoretical is 398). Chromatographic analysis indicated the reaction mixture to be 46 percent by weight of mono-2-(triacryloyloxymethyl)-ethyl succinate (SAMP) and 40 percent by weight of pentaerythritol tetraacrylate.

The SAMP could be purified by dissolving one part in about 1.4 parts of butyl acetate and extracting the solution with about 1.8 parts of 10% aqueous sodium carbonate. The layers were separated and the aqueous extract was combined with one part of butyl acetate and then while stirring was neutralized with concentrated hydrochloric acid. The butyl acetate layer was washed with saturated brine, dried over anhydrous magnesium sulfate and filtered. Triplicate titrations indicated that the purified product, free of solvent, had an acid equivalent weight of 435.4 and by chromatographic analysis to be 78% mono-2-(triacryloyloxymethyl)ethyl succinate and several unidentified components.

Step 2. Preparation of a "Product B": by the reaction of SAMP with a polyepoxide to form SAMP/EPON 1001.

Into a 1-liter 3-necked round bottom flask equipped with a stirrer, reflux condenser, and means for maintaining a dry atmosphere was charged: 766 g EPON ™ 1001 (diglycidyl ether of bisphenol A having an epoxy equivalent weight of 510 (1.5 eq.), 1540 g butyl acetate, 766 g (1.5 eq.) unpurified mono-2-(triacryloyloxymethyl)ethyl succinate (SAMP, prepared as described above), and 11.5 g benzyltriethylammonium chloride.

The mixture was heated to 105° C. while stirring and held at this temperature for 26 hours at which time analysis by titration indicated the presence of 6.82% of residual epoxy groups and 6.87% residual acid groups. The mixture was then characterized by infrared (IR), $^1$H nuclear magnetic resonance (NMR) spectroscopy and by reverse phase high performance liquid chromatography (RPLC) to contain in solution in butyl acetate at 50% by weight concentration of the adduct having the general formula:

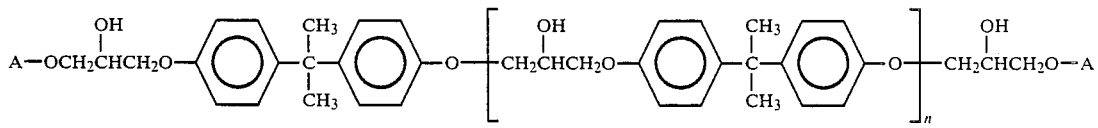

in which A is

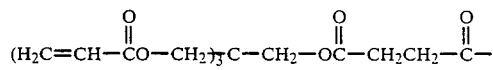

and n is on average 2.4 and unreacted materials that were originally present in the pentaerythritol triacrylate used in Step 1.

Steps 3 and 4. Preparation of a "Product C" by the reaction of SAMP/EPON 1001 with isocyanatoethyl methacrylate and succinic anhydride.

Into a 1-liter 3-necked round bottom flask equipped with a stirrer, reflux condenser, and means for maintaining a dry atmosphere was charged 500 g of the solution prepared in Step 2 (containing $$\frac{500}{3083.5} \times 1.5 = 0.243$$

equivalents or 0.122 moles having 4.4 hydroxyl groups per mole to provide 0.54 equivalents of hydroxyl), 53.8 g 2-isocyanatoethylmethacrylate (0.35 equivalents), and 0.125 g dibutyltin dilaurate (500 ppm with respect to solids). The mixture was stirred and heated to 55° C. under an atmosphere of dry air and held under these conditions for 4 hours. After standing for 2 days at room temperature, an infrared spectrum confirmed the absence of isocyanate. There was then added to the reaction mixture 18.7 g (0.19 moles) succinic anhydride and 18.9 g (0.19 eq.) triethylamine and the mixture heated at 90° C. for 1¾hours after which time, an infrared spectrum of the reaction mixture indicated the absence of anhydride. The reaction mixture was found to be 55.2% solids by heating a small sample to evaporate volatiles at 150° C. for 1 hour. IR and NMR spectroscopy and RPLC confirmed the adduct to have the general formula shown for the reaction product of step 2 in which about 65% of the hydroxyl groups had been replaced by

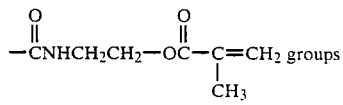

and about 35% of the hydroxyl groups had been replaced by

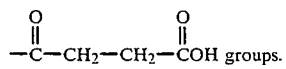

groups.

The product was designated SAMP/EPON 1001-IEM(0.65)-SA(0.35)-OH(0.0).

A portion of the above reaction product was diluted to 30% solids with methyl ethyl ketone. Then was added 4% based on total solids of Irgacure 184 (photoinitiator available from Ciba- Geigy) and 0.05% FC 431 (fluorochemical surfactant available from 3M). The solution was coated onto a 100 micrometer thick film of poly(ethylene terephthalate) using a #14 Meyer bar and dried in an oven at 75° C. for one minute providing a dried layer 2.5 to 5 micrometers thick. The coating was cured by two passes in air in a UV Processor Model OC 1202 ANIR (available from PPG Industries) under two UV lamps operating at 120 watts per centimeter and a belt speed 40 cm/sec. Discs having a diameter of 10 cm were cut from the sheets of film and abraded on a Taber ™ Abraser, available from Gardner/Neotec Division of Pacific Scientific, using a CS-10F abrasive wheel with a 500 g load for 100 cycles. The abrasion resistance is determined by measuring the haze value of the abraded film with a Gardner ™ Hazemeter Model No. XL-211, available from Gardner/Neotec Co. The cured layer exhibited 7.7 average Taber Haze (three replicates). Uncoated polyester had an average Taber Haze of 33.4 under the same conditions.

When this product was coated and cured as described in Example 1, Step 3, a coating was obtained that was resistant to 200 rubs with a cotton swab saturated with methyl ethyl ketone.

EXAMPLE 2

Step 1. The preparation of a "Product A" the adduct of dipentaerythritol pentaacrylate and succinic anhydride (SAND).

Following the general procedure of Step 1 of Example 1 there was heated at 105° C. for 21 hours the mixture:

2200 g (2.34 hydroxyl equivalents dipentaerythritol pentaacrylate having a hydroxy equivalent weight of 940, available from Sartomer Chem. Co., as SR-399).
223.05 g (2.23 moles) succinic anhydride and
18.2g (0.75% by weight) benzyltriethylammonium chloride.

At the end of the heating period, infrared spectroscopy showed disappearance of anhydride bonds and titration as in Example 1 showed an average acid equivalent weight of 1045.

Step 2. Preparation of "Product B" by the reaction of SAND with a polyepoxide to form SAND/DER 332.

The procedure of Example 1, Step 2 was repeated using 200 g of SAND (200/1045=0.19 eq.),
33.7 G DER 332 (diglycidyl ether of bisphenol A having an epoxy equivalent weight of 176 available from Dow, 33.7/176=0.19 equivalents of epoxy),
1.85 g benzyltriethylammonium chloride, and
156g butyl acetate to adjust the mixture to 60% solids.

After 21 hours, analysis by titration as done in Example 1 confirmed the reaction mixture to contain 5.9% unreacted carboxylic acid groups and 2.6% unreacted epoxy groups the adduct having the general formula shown in Example 1 in which A is

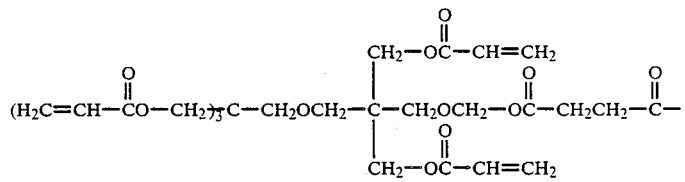

Step 4. Preparation of a "Product C" by the reaction of SAND/DER 332 with succinic anhydride.

To 300 g of the reaction mixture of Step 2 (containing $$\frac{300}{391.5} \times 0.19 \text{ or } 0.146$$

hydroxyl equivalents) was added 4.43 g (0.04 moles) succinic anhydride and 4.47 g of triethylamine. The mixture was stirred and heated at 105° C. for one hour, after which time infrared spectrum of the mixture indicated the absence of anhydride groups. It was calculated that 30% of the hydroxyl groups had been replaced by

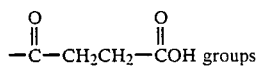

groups and 70% were unreacted and the product designated SAND/DER 332 —SA(0.3)—OH(0.7). When this material was coated and cured according to the procedure of Example 1, a coating was obtained that was resistant to 200 rubs with a cotton swab that had been saturated with methyl ethyl ketone.

EXAMPLE 3

Step 1.

SAMP was prepared following the procedure of Example 1, Step 1. On analysis it was found to have an average carboxylic acid equivalent weight of 536.

Step 2. Preparation of SAMP/DEN 438.

The procedure of Example 1, Step 2 was repeated using 74.8 g SAMP as prepared in Step 1 (0.14 equivalents)
25.2 g DEN 438 (0.14 equivalents of an epoxy novalac having an epoxy equivalent weight of 181 available from Dow)
1.0 g benzyltriethylammonium chloride
66.7 g butyl acetate (to provide a solution 60% in solids)

After heating the mixture at 105° C. for 24 hours analysis by titration indicated that 98% of the carboxyl groups and 97% of the epoxy groups had disappeared. The structure of the adduct had the general formula

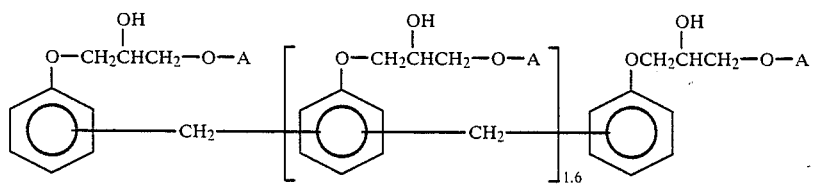

in which A is as defined in Example 1. It was designated as SAMP/DEN 438 and had a calculated average molecular weight of 1525.

Step 4.

To 30.5g of the reaction mixture of step 2 (containing $$\frac{30.5}{167.7} \times 0.14 = 0.0255$$

equivalents of hydroxyl groups) was added 0.79g succinic anhydride (0.0079 moles) and 0.79 g triethylamine. The mixture was stirred and heated at 105° C. for ½ hour, after which time infrared spectrographic analysis indicated the absence of anhydride groups. The product was designated SAMP/DEN 438-SA(0.3). When this material was coated and cured according to the procedure of Example 1, a coating was obtained that was resistant to 200 rubs with a cotton swab saturated with methyl ethyl ketone.

EXAMPLE 4

Step 1.

"Product A", SAMP was prepared according to the procedure of Example 1, Step 1. On analysis it was found to have an average carboxylic and equivalent weight of 561.25.

Step 2.

The procedure of Example 1, Step 2. was repeated using 52.8 g (0.30 eq., 176.0 epoxy equivalent weight) of DER 332 ™ available from Dow, 9.75 g (0.15 eq.) of itaconic acid, 84.0 g (0.15 eq., 561.25 and equivalent weight) of SAMP 1.2 g of benzyltriethylammonium chloride and 97.9 g of butyl acetate to bring the final solution solids to 60%.

The reaction mixture was heated to 105° C. and held at this temperature for 21 hours. At the end of this time, there was 2.7% residual acid groups and 4.5% residual epoxy groups. After 3.5 hours of additional heating there was 3.3% residual epoxide functionality.

Step 3.

To the reaction mixture was then added 9 g (0.09 eq.) of succinic anhydride and 9 g (0.09 eq.) of triethylamine. After 1.5 hours of reaction at 105° C., no anhydride peaks could be seen in the IR spectrum of the reaction mixture. The product is designated SAMP/DER 332/Itaconic Acid/DER 332/SAMP/SA(0.3-)/OH(0.7).

When this product was coated and abraded as described in Example 1, triplicate samples showed Taber haze values of 6.2, 7.2 and 7.6% for an average of 6.9% haze. When this product was coated and cured as described in Example 1, Step 3, a coating was obtained that was resistant to 200 rubs with a cotton swab saturated with methyl ethyl ketone.

EXAMPLE 5

Step 1.

"Product A", SAMP was prepared according to the procedure of Example 1, Step 1. On analysis it was found to have an average carboxylic acid equivalent weight of 539.25.

Step 2.

The procedure of Example 1, Step 2. was repeated using 180 g of SAMP prepared above (0.334 eq.)

49 g of XB-2793 (146.7 epoxy equivalent weight, 0.334 eq. 1,3-diglycidyl-5,5-dimethylhydantoin available from Ciba Geigy) and 1.15 g of benzyltriethylammonium chloride.

After heating the mixture at 105° C. for 24 hours, analysis indicated that 93% of the carboxyl groups and 94.5% of the epoxy groups were consumed. After 41 hours of reaction time, 96.8% of the epoxy was consumed. The reaction was diluted with 25.6 g of butyl acetate to provide a 90% solids solution.

Steps 3 and 4.

To 56.56 g of a 90% solids solution of the SAMP/XB-2793 adduct (containing $$\frac{56.56}{255.75} \times 0.334 = 0.074$$

equivalent of hydroxyl groups) was added 2.24 g (0.0224 moles) of succinic anhydride. After 1.5 hours of heating at 90° C., infrared analysis showed a disappearance of the anhydride bands. The reaction was diluted with 29.92 g of methyl ethyl ketone to a final concentration of 60% solids by weight. The product was designated SAMP/XB-2793/SA(0.3)/OH(0.7).

When this product was coated and abraded as described in Example 1, a coating was obtained that was resistant to rubs with a cotton swab saturated with methyl ethyl ketone.

EXAMPLE 6

Step 1.

A. By a procedure similar to that for Example 1, Step 2, 100 g (0.70 eq.) glycidyl methacrylate, 60.56 g (0.70 eq.) methacrylic acid, 1.20 g benzyltriethylammonium chloride and 0.08 g of p-methoxyphenol were heated together at 90° C. for 91 hours, at the end of which time titrations indicated the presence of 0.87% residual epoxy groups and 4.26% residual acid groups.

B. Next, by a procedure similar to that for Example 1, Step 1, 160.92 g (0.70 eq.) glycerol dimethacrylate (prepared in Step 1, A. above), 70.0 g (0.70 eq.) succinic anhydride, 1.16 g triphenylphosphine and 0.23 g 4-methoxyphenol were reacted for 26 hours at 90° C. Triplicate acid titrations provided an average carboxylic acid equivalent weight of 325.7±4.8. This product was designated as GMASA.

Step 2.

According to the procedure of Example 1, Step 2, 120.57 g (0.375 eq.) of GMASA, 66.0 g (0.375 eq.) of DER ™ 332 and 0.93 g benzyltriethylammonium chloride were reacted at 90° C. for 65 hours to yield a product with 2.66% residual epoxy groups and 3.06% residual acid groups. The reaction was then diluted to 90% solids with 20.6 g of methyl ethyl ketone. The product was designated as GMASA/DER 332.

Steps 3 and 4.

According to the procedure of Example 1, Step 3, 41.34 g of 90% solids methyl ethyl ketone solution (containing $$\frac{41.34}{208.1} \times 0.375 = 0.745$$

equivalents of hydroxyl groups). GMASA/DER 332, 2.24 g (0.022 moles) succinic anhydride were reacted in an additional 9.0 g of methyl ethyl ketone (to bring the total solids to 75%) for 1 hour at 87° C., at which time no anhydride peaks could be seen in the IR spectrum of the reaction mixture. This product was designated as GMASA/DER 332-SA(0.3).

When this product was coated and cured as described in Example 1, Step 3, a coating was obtained that was resistant to 200 rubs with a cotton swab saturated with methyl ethyl ketone.

EXAMPLES 7–29

Other "Products C", listed in Table I were prepared by reaction of SAMP (prepared as described in Example 1) with the polyepoxide resins shown to form a "Product B" following the procedure described in Step 2 of Example 1. Each "Product B" was then reacted with isocyanatoethyl methacrylate (IEM) or 2-isopropenyl-4,4-dimethyl-1,3-oxazolin-5-one (IDM) and succinic acid in the equivalent ratios indicated following the procedure described for Steps 3 and 4 of Example 1. For reactions with IDM, 2% by weight with respect to solids of trifluoroacetic acid was used as catalyst at temperatures of about 55° C. for 24 hours.

TABLE 1

"Product C"[a]

| "Product B" Ex. | (b) (c) (d) (e) (f) | MW[g] | EEW[h] | CEW[i] | SEN[j] |
|---|---|---|---|---|---|
| 7. | SAMP/EPON1001-1EM(0.0)-SA(0.2)-OH(0.8) | 2388 | 392 | 2791 | 0.5 |
| 8. | SAMP/EPON1001-1EM(0.4)-SA(0.4)-OH(0.6) | 2474 | 412 | 1445 | 0.5 |
| 9. | SAMP/EPON1001-1EM(0.6)-SA(0.6)-OH(0.6) | 2560 | 429 | 997 | 0.3 |
| 10. | SAMP/EPON1001-1EM(0.9)-SA(0.9)-OH(0.1) | 2688 | 448 | 687 | 0.4 |
| 11. | SAMP/EPON1001-1DM(0.2)-SA(0.2)-OH(0.3) | 2719 | 334 | 3176 | 1.5 |
| 12. | SAMP/EPON1001-1DM(0.5)-SA(0.4)-OH(0.1) | 2805 | 345 | 1638 | 1.0 |
| 13. | SAMP/EPON1001-1EM(0.65)-SA(0.2)-OH(0.15) | 2802 | 319 | 3273 | 1.5 |
| 14. | SAMP/EPON1001-1EM(0.8)-SA(0.2-OH(0.0) | 2898 | 307 | 3386 | 1.5 |
| 15. | SAMP/EPON1002-1EM(0.0)-SA(0.2)-OH(0.8) | 2693 | 449 | 2526 | 0.4 |
| 16. | SAMP/EPON1002-1EM(0.0)-SA(0.4)-OH(0.6) | 2799 | 467 | 1313 | 0.3 |
| 17. | SAMP/EPON1002-1EM(0.0)-SA(0.6)-OH(0.4) | 2906 | 488 | 909 | 0.3 |
| 18. | SAMP/EPON1002-1EM(0.0)-SA(0.9)-OH(0.1) | 3066 | 511 | 639 | 0.3 |
| 19. | SAMP/EPON1002-1DM(0.5)-SA(0.2)-OH(0.3) | 3103 | 358 | 2910 | 1.5[k] |
| 20. | SAMP/EPON1002-1DM(0.5)-SA(0.4)-OH(0.1) | 3210 | 371 | 1506 | 1.0 |
| 21. | SAMP/EPON1004-1EM(0.0)-SA(0.2)-OH(0.8) | 3190 | 532 | 2322 | 0.4 |
| 22. | SAMP/EPON1004-1EM(0.))-SA(0.4)-OH(0.6) | 3328 | 555 | 1211 | 0.3 |
| 23. | SAMP/EPON1004-1EM(0.0)-SA(0.6)-OH(0.4) | 3465 | 578 | 841 | 0.3 |
| 24. | SAMP/EPON1004-1EM(0.0)-SA(0.9)-OH(0.1) | 3671 | 612 | 594 | 0.3 |
| 25. | SAMP/EPON1004-1EM(0.5)-SA(0.2)-OH(0.3) | 3720 | 295 | 2707 | 1.0[k] |
| 26. | SAMP/EPON1004-1EM(0.5)-SA(0.4)-OH(0.1) | 3857 | 409 | 1404 | 0.5 |
| 27. | SAMP/EPON1007-1EM(0.0)-SA(0.5)-OH(0.5) | 4890 | 815 | 1223 | 0.2 |
| 28. | SAMP/EPON1009-1EM(0.0)-SA(0.5)-OH(0.5) | 6785 | 1131 | 1131 | 0.2 |
| 29. | SAMP/DER332-1DM(0.5)-SA(0.2)-OH(0.3) | 1910 | 273 | 4775 | 0.5 |

[a]"Product C", the reaction product of a "Product B" [the reaction product of [b]SAMP (the reaction of product of pentaerythritol triacrylate with succinic acid) with the polyepoxide[c]] with (d) where IEM is isocyanatoethyl methacrylate and IDM is 2-isopropenyl-4,4-dimethyl-1,3-oxazolin-5-one and with (e) succinic acid, wherein the fraction of total hydroxyls in the Product B reacted with IEM and IDM is shown in parenthesis. (g) calculated molecular weight of the "Product C", (h) calculated ethylenic equivalent weight of the "Product", (i) calculated carboxylic acid equivalent weight of the "Product C", (j) relative sensitivity of the "Product C" to tungsten light with respect to reference composition. (k) tetrahydrofuran was used to improve the solubility of the "Product C".

DETERMINATION OF PHOTOSENSITIVITY OF COMPOSITIONS MADE USING "PRODUCTS C"

A. The photosensitivity of the compositions of the invention is expressed in Table I, above, as a ratio of its speed to that of a reference high speed radiation sensitive photopolymerizable composition. This ratio is determined by the relationship $$SEN = \frac{(\sqrt{2})^x}{(\sqrt{2})^{12}}$$

in which SEN is the relative sensitivity of the composition being compared, x is the number of solid $\sqrt{2}$ steps found for the composition as determined below, and $(\sqrt{2})^{12}$ is the expression for the sensitivity of the reference composition which evidenced 12 solid $\sqrt{2}$ steps as determined below.

B. The Reference Composition

A coating composition was prepared by mixing under safe light in parts by weight 2.06 parts SR-295 ™ (pentaerythritol tetraacrylate from Sartomer Co.)

2.74 parts of 60% solution in methyl ethyl ketone of urethane oligomer P-II, described in U.S. Pat. No. 4,228,232, column 11, lines 3–39.

0.26 parts of diphenyliodonium hexafluorophosphate 0.07 parts of a sensitizer having the structure

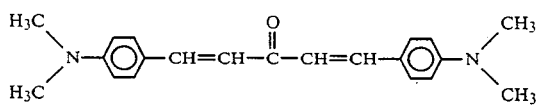

52.8 parts of 71.8% n-propanol/28.2% water azeotrope
24.6 parts of 1.5% Klucell M ™ (hydroxypropylcellulose resin from Hercules Co.) in propanol/water azeotrope
4.0 parts of a millbase composition consisting of 13.7% solids in propanol/water azeotrope of a mixture of 1 part Sunfast Blue Pigment and 2 parts of Formvar ™ 12/85 (a polyvinyl alcohol acetal available from Monsanto Chemical Co.).

The coating composition was coated onto grained and anodized sheet aluminum at a coating weight of 100-200 milligrams/square foot (1.1 to 2.1 grams/square meter) and dried at 65° C. for 2 minutes. The coating was overcoated with a 5% aqueous polyvinyl alcohol solution and 0.03% Triton ™ X-100 (a surfactant available from Rohm and Haas at a coating weight of 100-200 mg/ft² (1.1 to 2.1 g/m²) and dried at 65° C. for 2 minutes. The coated sheets were then exposed through a 21 step √2 Stouffer Sensitivity Exposure Guide (available from Stouffer Co.) for two seconds with a 16,000 foot candle tungsten light source at 25 cm (3M Model 70 light source available from 3M Co.) and developed by light rubbing under an aqueous solution containing 4% n-propanol, 2% sodium metasilicate and 0.06% Dowfax ™ 2AL (a surfactant available from Dow Chemical Co.). There was present after development solid steps.

C. Photosensitivity of the Composition of the Invention

A coating composition was prepared by mixing under safe light in parts by weight
2.30 parts of SR-295
3.60 parts of 50 to 60%. solution in butyl acetate of a "Product C"
36 parts n-propanol/water azeotrope
2.4 parts of a 12.7% solution of Formvar 12/85 in n-propanol/water azeotrope
0.4 parts triethylamine
then, to 23 parts of the above solution was added
0.3 parts of the sensitizer used in B, above
3.0 parts of millbase composition used in B, above
0.09 parts PVP K90 ™ (polyvinylpyrrolidone, MW 360,000 from GAF Corp.)
0.12 parts diphenyliodonium hexafluorophosphate The above solution was then coated and topcoated as described for the reference composition and exposed and developed as described there. From the number of solid √2 steps evidenced the relative sensitivity of the composition was calculated using the relationship above.

Various modifications and alterations of this invention will become apparent to those skilled in the art without departing from the scope and spirit of this invention, and it should be understood that this invention is not to be unduly limited to the illustrative embodiments set forth herein.

We claim:
1. A photopolymerizable composition comprising
1) a compound having a formula selected from the group consisting of Formulae I, III, IV, and v, wherein Formula I is:

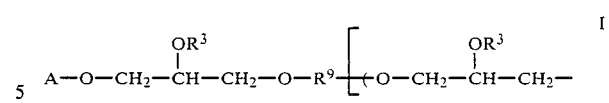

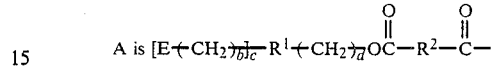

wherein

A is 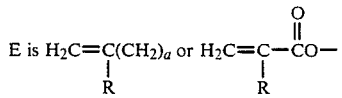

in which

E is 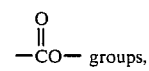

in which
R is hydrogen, halogen, or methyl, and
a is an integer of 1 to 6;
$R^1$ is a polyvalent aliphatic group having 1 to 15 carbon atoms and a valence of $c+1$, and optionally containing one or two catenary oxygen or $$-\overset{O}{\underset{\|}{C}}O-\text{ groups,}$$

b is zero or an integer of 1 to 6,
c is an integer of 2 to 5,
d is zero or an integer of 1 to 6; and
$R^2$ is a divalent linear or branched saturated or unsaturated aliphatic group having 2 to 10 carbon atoms or a divalent arylene group having 6 to 10 carbon atoms;
$R^3$ is selected from the group consisting of hydrogen,

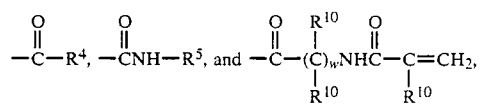

in which each $R^{10}$ is hydrogen or lower alkyl of 1 to 4 carbon atoms, and each $R^4$ and $R^5$ is independently an organic group selected from alkyl groups having 1 to 10 carbon atoms, ethylenically unsaturated groups having 2 to 10 carbon atoms, cycloalkyl groups having 5 to 7 ring carbon atoms and a total of 5 to 10 carbon atoms, and aryl groups having 6 to 10 carbon atoms, with the provision that 5 to 100 mole percent of all $R^3$ groups are

in which $R^4$ is substituted by

and w is 1 or 2;

$R^6$ is a divalent organic group;

$R^9$ is $R^6$ or a polyvalent organic group having a valence of g+1, in which g is an integer having a value of 1 to 10, that is aliphatic, cycloaliphatic, or aromatic and having a weight average molecular weight of in the range of 28 to 1000, and h is zero or a number having an average value of up to 20, with the proviso that when $R^9$ is not $R^6$, then h is zero; Formula III is:

$$A-O-CH_2-\overset{OR^3}{\underset{|}{CH}}-CH_2-S-R^9-S-CH_2-\overset{OR^3}{\underset{|}{CH}}-CH_2-O-A \quad III$$

wherein A, $R^3$, and $R^9$ are as previously defined; Formula IV is:

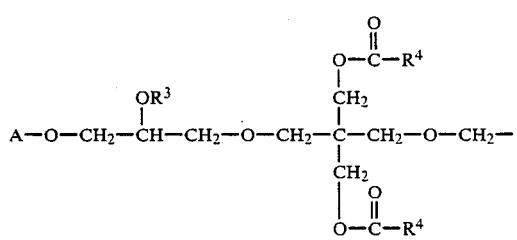

wherein A, $R^3$, and $R^4$ are as previously defined; and Formula V is:

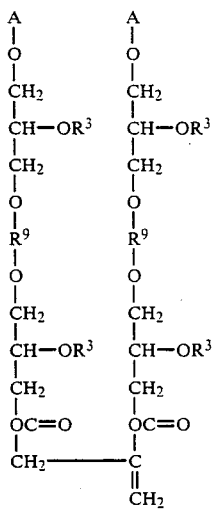

wherein A, $R^3$, and $R^9$ are as previously defined, 2) a binder resin, and 3) a radiation sensitive system capable of initiating free radical polymerization.

2. The composition according to claim 1 wherein A of said compound is selected from the group consisting of

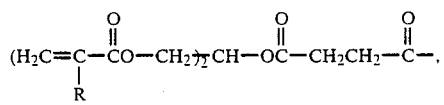

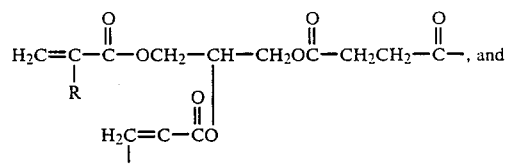

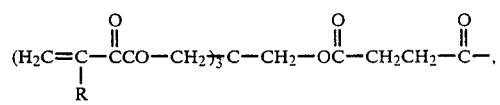

wherein R is hydrogen, halogen, or a methyl group.

3. The composition according to claim 1, wherein A of said compound is the group

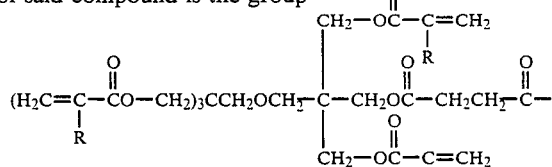

wherein R is as previously defined.

4. The composition according to claim 1 wherein $R^2$ of said compound further comprises at least one of an ether oxygen atom, a cycloalkylene group having 5 to 7 atoms in the ring and up to 5 carbons in one or more pendent groups.

5. The composition according to claim 1 wherein when at least one of $R^4$ and $R^5$ of said compound is an ethylenically unsaturated group, said ethylenically unsaturated group being selected from the group consisting of a vinyl group, an acryloyloxy group, and an acrylamido group.

6. The photopolymerizable composition according to claim 1 further comprising at least one copolymerizable ethylenically unsaturated monomer.

7. The composition according to claim 1, wherein said compound has been radiation polymerized to provide a cured composition.

8. The photopolymerizable composition according to claim 6 which has been radiation polymerized.

9. A layered structure comprising a substrate bearing a layer of the composition according to claim 1.

10. A layered structure comprising a substrate bearing a layer of the composition according to claim 6.

11. A substrate bearing a continuous or discontinuous layer of the radiation polymerizable composition according to claim 1.

12. A substrate bearing a continuous or discontinuous layer of the radiation polymerizable composition according to claim 6.

13. The layered structure according to claim 9 which is a printing plate.

14. The layered structure according to claim 10 which is a printing plate.

15. The layered structure according to claim 9 which is a proofing film.

16. The layered structure according to claim 10 which is a proofing film.

* * * * *

UNITED STATES PATENT AND TRADEMARK OFFICE
CERTIFICATE OF CORRECTION

PATENT NO. : 4,956,265

DATED : September 11, 1990

INVENTOR(S) : Thomas P. Klun et al

It is certified that error appears in the above-indentified patent and that said Letters Patent is hereby corrected as shown below:

On the Cover Sheet, under [56] References Cited, U.S. Patent Documents, add:

-- 3,367,992  2/1968  Beardon           260/837
   3,448,089  6/1969  Celeste           260/78.5
   3,634,542  1/1972  Dowd et al.       260/837
   3,980,483  9/1976  Nishikubo et al.  96/115
   4,162,274  7/1979  Rosenkranz        528/75
   4,187,257  2/1980  Nielsen           525/445 --.

On the Cover Sheet, under [56] References Cited, Foreign Patent Documents, add

-- 60-121444  6/1985  Japan --.

Col. 12, lines 26-27, "4-methacryloylbxycyclohexyl-isocyanate" should read -- 4-methacryloyloxycyclohexyl-isocyanate --.

Col. 13, line 9, "n-octyl acrylate.," should read -- n-octyl acrylate, --.

Col. 20, line 48, "resistant to rubs" should read -- resistant to 200 rubs --.

UNITED STATES PATENT AND TRADEMARK OFFICE
CERTIFICATE OF CORRECTION

PATENT NO. : 4,956,265
DATED : September 11, 1990
INVENTOR(S) : Thomas P. Klun et al.

It is certified that error appears in the above-indentified patent and that said Letters Patent is hereby corrected as shown below:

Col. 21-22, Table 1, Example 8, "SAMP/EPON1001-1EM(0.4)-SA(0.4)-OH(0.6)" should read -- SAMP/EPON1001-1EM(0.0)-SA(0.4)-OH(0.6) --.

Col. 21-22, Table 1, Example 9, "SAMP/EPON1001-1EM(0.6)-SA(0.6)-OH(0.6)" should read -- SAMP/EPON1001-1EM(0.0)-SA(0.6)-OH(0.6) --.

Col. 21-22, Table 1, Example 10, "SAMP/EPON1001-1EM(0.9)-SA(0.9)-OH(0.1)" should read -- SAMP/EPON1001-1EM(0.0)-SA(0.9)-OH(0.1) --.

Col. 21-22, Table 1, Example 11, SAMP/EPON1001-1DM(0.2)-SA(0.2)-OH(0.3)" should read -- SAMP/EPON1001-1DM(0.5)-SA(0.2)-OH(0.3) --.

Col. 22, Table 1, Example 25, under the column "EEW", "295" should be -- 395 --.

Col. 22, Table 1, Example 29, under the column "EEW", "273" should be -- 272 --.

UNITED STATES PATENT AND TRADEMARK OFFICE
CERTIFICATE OF CORRECTION

PATENT NO. : 4,956,265
DATED : September 11, 1990
INVENTOR(S) : Thomas P. Klun et al.

It is certified that error appears in the above-indentified patent and that said Letters Patent is hereby corrected as shown below:

Col. 22, in the footnote to Table I, fifth line of the footnote, ""Product", (i)" should be -- "Product C", (i) --.

Col. 23, line 67, "iv, and v" should be -- IV, and V --.

Signed and Sealed this

Fourth Day of October, 1994

Attest:

BRUCE LEHMAN

*Attesting Officer*     *Commissioner of Patents and Trademarks*